United States Patent [19]
Maehashi

[11] 4,196,362
[45] Apr. 1, 1980

[54] CLEAR SIGNAL GENERATOR CIRCUIT

[75] Inventor: Yukio Maehashi, Tokyo, Japan

[73] Assignee: Nippon Electric Co., Ltd., Tokyo, Japan

[21] Appl. No.: 885,219

[22] Filed: Mar. 10, 1978

[30] Foreign Application Priority Data

Mar. 12, 1977 [JP] Japan .................................. 52-26603

[51] Int. Cl.² ........................................... H03K 5/153
[52] U.S. Cl. .................................... 307/350; 307/279; 307/363; 307/304
[58] Field of Search ............... 307/350, 354, 363, 291, 307/293, 279, 304

[56] References Cited
U.S. PATENT DOCUMENTS 3,950,654  4/1976  Broedner et al. ................. 307/293 X Primary Examiner—John Zazworsky
Attorney, Agent, or Firm—Hopgood, Calimafde, Kalil, Blaustein & Lieberman

[57] ABSTRACT

A clear signal generating circuit for initializing a logic circuit upon the application of power to the logic circuit. The generator circuit comprises a level detection circuit for generating a detection signal when the power supply voltage reaches or exceeds a predetermined value, a counter circuit which commences to count in response to the detection signal and which generates a trigger pulse upon reaching a predetermined count and a status storage circuit which is placed in a first state in response to the occurrence of the detection signal and placed in a second state in response to the trigger pulse. The output of the status storage circuit is utilized as the generator circuit output.

6 Claims, 7 Drawing Figures

CLEAR SIGNAL GENERATOR CIRCUIT

FIELD OF THE INVENTION

This invention relates to a circuit to generate a signal for placing an electronic device into a predetermined initial state in response to the application of power thereto and more particularly, to a circuit which automatically generates a clear signal for resetting a logic circuit included in a digital circuit device constructed primarily of insulated-gate field-effect transistors (hereinbelow, referred to as "IGFETs").

BACKGROUND OF THE INVENTION

When the application of power to an electronic circuit is accomplished by closing a switch, the changing state of the voltage supplied to the electronic circuit can be described as follows. First, the voltage supplied to the circuit is too low for the electronic circuit to operate and this state may be referred to as the inactive region. Next an unstable region is encountered in which the voltage begins to increase to some extent and although the electronic circuit may appear to operate, suitable operation of the circuit is not ensured. Finally, when the voltage supply has become sufficiently high, a stable region is established which ensures the stable operation of the electronic circuit.

The three regions discussed above result in problems when first applying power to a circuit in that a large number of storage circuits, such as registers and flip-flops employed in electronic circuits do not always assume fixed states in response to changes in the surrounding conditions, even when the circuit reaches the stable region. That is, merely by applying power and reaching the stable region, the storage circuits do not always assume predetermined initial states and therefore stable operation of the electronic circuit cannot be expected. Accordingly, in order to properly operate the electronic circuit after the power supply has reached the stable state a clear signal for placing the storage circuits into predetermined states is required to be applied to the storage circuits prior to circuit operation. In electronic calculators such a clear signal is generated by manually operating a clear key. In addition so-called auto-clear signal generator circuits are known in which the clear signal for setting the storage circuits is generated automatically without the necessity for manual manipulation as described above.

The clear signal generated by an auto-clear signal generator circuit (hereinafter referred to as an auto-clear signal), utilized to preset a storage circuit into a predetermined initial state, is required to be a signal which assumes a first state upon arrival of the power supply at the stable region and which assumes a second state after a predetermined time has elapsed subsequent to the application of power. That is, the auto-clear signal must place the storage circuits into a predetermined state when the signal is in the first state, and the clear signal must subsequently assume the second state so as to enable the electronic circuit to operate properly.

In order to generate such a auto-clear signal, there has heretofore been adopted, as described in Japanese Utility Model Registration Application Publication No. 54879/1970, a monostable multivibrator which receives a trigger signal to assume the first state upon the application of power and which assumes the second state after a predetermined time. When a plurality of power supplies are used in a circuit, one is selected, and the clear signal is generated by a monostable multivibrator in response to only the specific power supply selected. The period of time in which the monostable multivibrator shifts from the first state to a stable second state is determined by a time-constant circuit consisting of a capacitor and a resistor. However, as is well known, it is undesirable to form such a capacitor and resistor within a semiconductor integrated circuit in which the storage circuits, control circuits, etc. are constructed of IGFETs. The reason for this is that such a capacitor requires a high capacitance value and this results in the use of a large area in the semiconductor integrated circuit, thereby hindering the miniaturization of the semiconductor integrated circuit. In addition, to incorporate the capacitor and the resistor into the semiconductor integrated circuit is essentially undesirable from both the viewpoint of precision production and the viewpoint of production cost.

Therefore an auto-clear signal generator circuit, made from a monostable multivibrator, cannot be easily realized as a semiconductor integrated circuit, and hence the assemblage of such a device becomes intricate. Moreover, a semiconductor integrated circuit which incorporates storage circuits, control circuits, etc. requires additional external terminals for a non-integrated auto-clear signal generator circuit. In addition in instances where semiconductor integrated circuits require a large number of power supplies it is desirable to sense the stable region or regions of any other power supply or supplies in addition to the specified one. This is difficult to achieve with a monostable multivibrator auto-clear signal generator circuit. Also, in the case where a semiconductor integrated circuit controls peripheral equipment, it is desirable to sense the stable regions or voltage regions of the power supply of the peripheral equipment in addition to the power supply of the integrated circuit per se. This is also difficult to achieve with a monostable multivibrator auto-clear signal generator circuit.

It is therefore an object of this invention to provide a clear signal generator circuit which can be realized within a semiconductor integrated circuit.

It is another object of this invention to provide a signal generator circuit which generates a signal, during a predetermined period of time, in response to the application of power.

It is a further object of this invention to provide a clear signal generating circuit which can accurately control the transit time from a first state to a second stable state without an RC time-constant circuit.

It is another object of this invention to provide an auto-clear signal generator circuit suitable for a semiconductor integrated circuit having at least two proper supplies to be sensed.

SUMMARY OF THE INVENTION

A clear signal generator circuit in accordance with this invention comprises a level detection circuit for generating a detection signal when a voltage of at least one power supply reaches or exceeds a predetermined value, a counter circuit which commences a counting operation in response to the detection signal, the counter circuit generating a trigger pulse upon reaching a predetermined count, and a status storage circuit which is placed in a first state in response to the activation of the power supply and is placed in a second state in response to the trigger pulse. The output of the status storage circuit is utilized as an output of the signal generator circuit and the transient time from first state to second state is defined by the counter circuit. The predetermined value of the power supply voltage normally ranges between ground level and a specified power supply voltage.

The clear signal generator circuit, in accordance with this invention, is preferably a circuit arranged within a semiconductor integrated circuit constructed mainly of insulated-gate field-effect transistors on the same semiconductor substrate. The generator circuit comprises a level detection portion for generating at least one detection signal upon sensing that at least one supply voltage has reached a predetermined value, a counter circuit which commences a counting operation in response to receiving at least one detection signal, the counter circuit generating a trigger signal when reaching a predetermined count, status storage portion adapted to be placed into a first state in response to activation of the power supply and placed into a second state upon receipt of the trigger signal, and means for deriving an output of the status storage portion as a clear signal.

In accordance with another aspect and feature of this invention an auto-clear signal generator circuit is arranged in a semiconductor integrated circuit constructed mainly of insulated-gate field-effect transistors on the same semiconductor substrate and the circuit performs logical operations in conjunction with peripheral equipment. The circuit comprises a level detection portion for generating at least one detection signal upon sensing that the supply voltage for the semiconductor integrated circuit, and the supply voltage for the peripheral equipment, have reached their respective predetermined values, a counter circuit which commences a counting operation in response to at least one detection signal, the counter circuit generating a trigger signal when reaching a predetermined count, and a status storage circuit adapted to be placed into a first state upon activation of the power supply and adapted to be placed into a second state upon receipt of the trigger signal, an output of the status storage means being used as an auto-clear signal.

In accordance with a further aspect and feature of this invention, a signal generator circuit can be easily realized in integrated circuit form and the circuit can include a logical timing circuit, that does not require a capacitor and a resistor. Furthermore, the period of the clear signal, that is the period of the first state of the storage portion can be optionally and accurately set due to the counter circuit.

It is another feature of this invention that the circuit which generates the clear signal can be responsive to a plurality of power supplies.

These and other objects and features of this invention will be more fully understood from the following description of an illustrative embodiment thereof taken in conjunction with the accompanying drawings.

DETAILED DESCRIPTION

Figure 1:
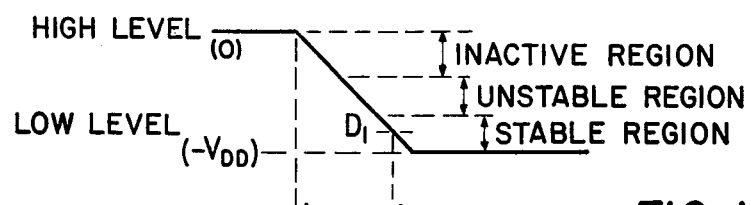
FIG. 1 is a diagram showing the transistion regions of a voltage supply after the activation of power.

Shown in FIG. 1 are three transition regions in voltage supplied to an integrated circuit. The three regions result when a power supply of a specified value $-V_{DD}$, is applied to the integrated circuit via a power switch closed at time $t_{ON}$. The three regions are in the order of an inactive region, an unstable region and a stable region. Voltage $D_1$ indicates a certain voltage which is near the unstable region but which never falls outside of the stable region even when some fluctuation of the boundary between both regions occurs. Voltage $D_1$ will be referred to hereinafter as the predetermined voltage value or the detection level. When the supply voltage has reached point $D_1$, at a time $t_D$, the operation of the auto-clear signal generator circuit commences.

Now, with reference to FIG. 2, a first embodiment according to the present invention will be described. In the following description, P-channel type IGFETs are used, and a high level (grounded level) and a low level ($-V_{DD}$) correspond to logic "1" and logic "0" respectively.

Figure 2:
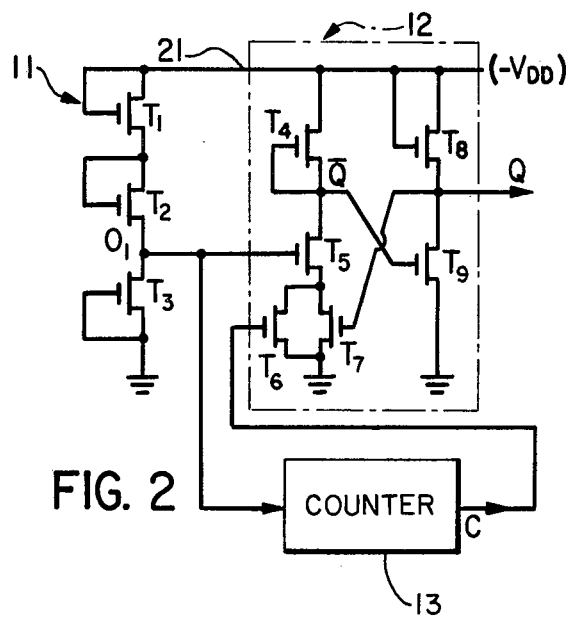
FIG. 2 is a circuit diagram showing the arrangement of an auto-clear signal generator circuit according to a first embodiment of this invention.

As shown in FIG. 2, an auto-clear signal generator circuit consists of a level detection circuit 11, a status storage circuit 12, for carrying out the status setting, and a counter circuit 13. The level detection circuit 11 is constructed of an enhancement type IGFET $T_1$, the drain and gate of which are connected in common to a power supply line 21, which is in turn connected to the power in the level detection circuit source of a voltage $-V_{DD}$ via a power switch (not shown). Also included is an enhancement type IGFET $T_2$, the drain and gate of which are connected in common to the source of the IGFET $T_1$, and an enhancement type IGFET $T_3$, the source and gate of which are commonly grounded and the drain of which is connected to the source of the IGFET $T_2$. The drain output is also taken as output $O_1$ which is used to indicate the predetermined value $D_1$ in the stable region of the voltage supplied at the power supply line 21. Value $D_1$ is detected by means of the IGFETs $T_1$, $T_2$ and $T_3$. In this level detection circuit 11, the predetermined value $D_1$ is set to be substantially equivalent to a total value of the threshold voltages of the IGFETs $T_1$ and $T_2$. IGFET $T_3$ operates as an impedance to bias the output $O_1$ at nearly ground level.

The detection signal derived from the output $O_1$ is set so as to remain at a high level while the voltage supplied at line 21 is in the unstable region, and to become a low level when the voltage supplied has reached the predetermined value $D_1$ in the stable region. Although, in this embodiment, the common gate-drain circuit paths of the IGFETs $T_1$ and $T_2$ are connected in series, in two stages, only one stage of the IGFET $T_1$ or three or more stages can be utilized in correspondence to the value of the detection level, and further, the threshold voltage of each transistor can be controlled, whereby detection level, i.e., the predetermined level $D_1$ can be set as desired. In case that the predetermined level $D_1$ is required to be set within the inactive region, the detection signal can be produced through use of a depletion type IGFET, in place of IGFET $T_3$.

Status storage circuit 12 is based on a flip-flop construction and comprises a depletion type IGFET $T_4$, and enhancement type IGFETs $T_5$ through $T_9$. A drain and a gate of IGFET $T_8$ are connected to the power supply line 21 and to the source thereof, at a node $\overline{Q}$, respectively.

A source and a gate of IGFET $T_5$ are connected to the node $\overline{Q}$ and to the output $O_1$ respectively. A drain of IGFET $T_5$ is connected to sources of IGFET $T_6$ and $T_7$ in common, drains of which are commonly connected to ground level. A drain and a gate of IGFET $T_8$ are connected to the power supply line 21 and the source of IGFET $T_8$ is connected to a drain of IGFET $T_9$, the source of which is connected to ground level. The node $\overline{Q}$ is connected to a gate of IGFET $T_9$. The gate of IGFET $T_7$ is connected to the source of IGFET $T_8$ and is drawn out as an output Q.

The counter circuit 13 is held reset while the output $O_1$ of the level detection portion 11 is at a logic "1" level and the counter circuit starts the counting operation, to provide the gate of the IGFET $T_6$ with a periodic trigger pulse C, when the supply voltage has reached the predetermined value $D_1$.

Counter circuit 13 can be realized with a timing pulse generator circuit constructed of a ring counter, and a timer circuit which performs time settings by a counting operation. The counter circuit 13 generates the trigger pulse C for resetting the flip-flop of the status storage portion 12 after a period of a predetermined time. With counter circuit 13, the period, i.e. the pulse width of the auto-clear signal, can be arbitrarily and accurately set because of the counter construction.

Figure 3:
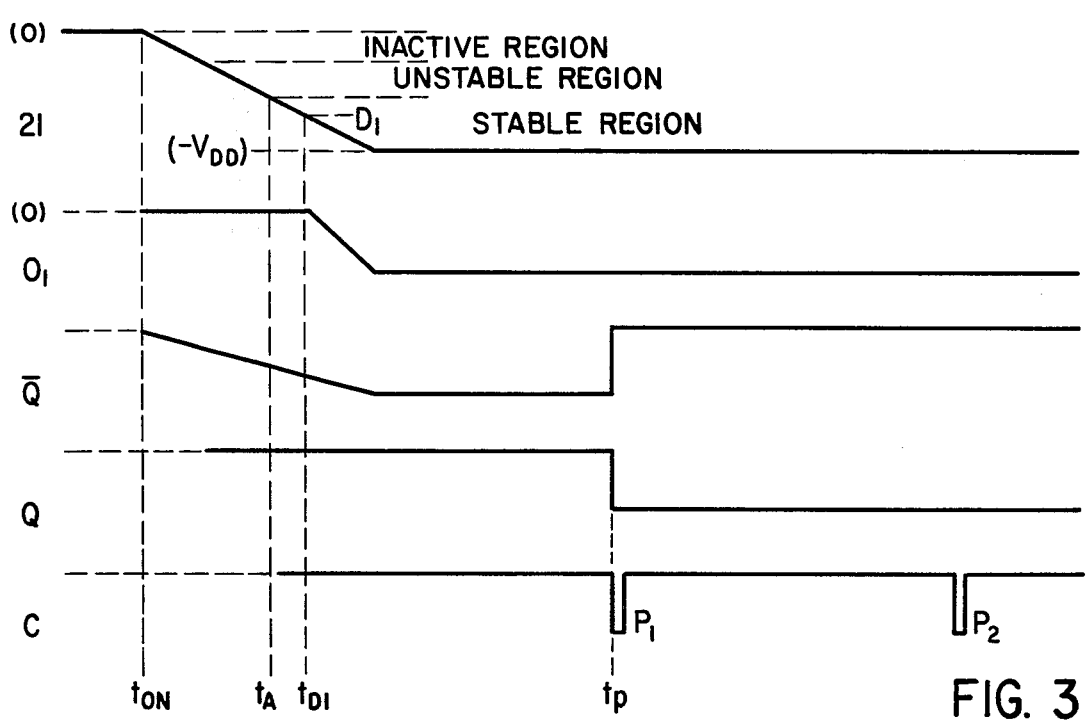
FIG. 3 is a timing diagram showing the operation of the circuit in FIG. 2.

Referring now to FIG. 3, the operation of the embodiment shown in FIG. 2 will be explained. In FIG. 3, the same symbols used in FIG. 2 are also used to express the respective signal portions. At time $t_{ON}$, the voltage of the power supply line 21 begins to move towards the voltage $-V_{DD}$ of the power source. Detection signal $O_1$, from the level detection portion 11, provides a logic "1" of ground level, from $t_{ON}$ until the voltage of line 21 reaches the detection level at time $t_{D1}$. This is due to the fact that IGFETs $T_1$ and $T_2$ are not conducting in this period. Therefore, the node $\overline{Q}$ of the status storage portion 12 changes from the ground level, i.e. a logic "1", towards the voltage $-V_{DD}$, i.e. a logic "0", along with the change of the voltage supplied to the line 21. This is due to the fact that IGFET $T_5$ is non-conductive in response to detection signal $O_1$ being equal to a logic "1".

Output Q holdes a logic "1" level after the low level of the output $\overline{Q}$ has reached the threshold voltage of the IGFET $T_9$. This places IGFET $T_9$ into a conductive state. Here, since the load IGFET's $T_4$ and $T_8$ are depletion type and enhancement type IGFET's respectively, the node $\overline{Q}$ can easily become a logic "0" even in the inactive region. Under this state, the detection signal $O_1$ of the logic "1" level also functions as a reset signal for the counter circuit portion 13. More specifically, when the supply voltage has proceeded through the unstable region, and has reached the stable region, the counter circuit 13 begins to operate normally. Therefore, in the period in which the detection signal $O_1$ is in a logic "1" state, the counter circuit portion 13 is reset and has its initial value set. This state is sustained until the supply voltage reaches the predetermined detection level $D_1$ at time $t_{D1}$.

After the supply voltage $-V_{DD}$ has reached the detection level at time $t_{D1}$, the detection signal $O_1$ assumes a logic "0" state along with the voltage of the power supply line 21. Accordingly, the IGFET $T_5$, in the status storage portion 12, is placed into a conductive state. Since the reset signal, i.e. the detection signal of the logic "1" state, vanishes, the counter circuit 13 executes the counting operation from the time $T_{D1}$. When the counter circuit 13 has completed a predetermined number of counts, at time $t_P$, it generates a trigger pulse $P_1$.

Trigger pulse $P_1$ is fed to the gate of the IGFET $T_6$ in the status storage circuit 12 and in response thereto IGFET $T_6$ becomes conductive. At this time, the IGFET $T_5$ is also conductive because the detection signal $O_1$ is in the logic "0" state. Therefore, the node $\overline{Q}$ assumes a logic "1" state, and the output Q is inverted to the low level of the logic "0" state.

Thus, the high level of the output Q, till the time $t_p$, that is the first state of the status storage circuit 12, is utilized to set the storage circuits in their respective initial states. The low level of the output Q, from the time $t_p$, i.e., the second state of the status storage portion 12, enables the storage circuits to operate normally. The auto-clear signal which takes successively the first state (high level) and the second state (low level) is derived from the output Q. As is apparent from the above description, the width of the signal in the first state can be optionally set by altering the counter circuit portion 13.

A second embodiment of this invention will now be described with reference to FIGS. 4(a) and 4(b).

In this embodiment, two power supplies of the specified voltages $-V_{DD}$ and $-V_{DD}$, supplied at the power supply lines 21' and 22 respectively, are to be detected when they reach their respective predetermined voltage levels. Namely, the detection signal $O_2$ is generated from both the power supplies.

Figure 4A:
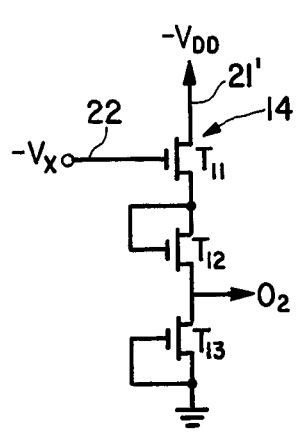
FIG. 4(a) is a diagram showing a level detector circuit for two supply voltages according to a second embodiment of this invention.

As shown in FIG. 4(a), the level detection circuit 14 used in this embodiment comprises enhancement type IGFETs $T_{11}$ and $T_{12}$ and a depletion type IGFET $T_{13}$. The gate and the drain of IGFET $T_{11}$ are connected to the power supply line 22 and to the power supply line 21' respectively. The IGFETs $T_{12}$ and $T_{13}$ are connected in the same manner as that of the IGFETs $T_2$ and $T_3$ in FIG. 2.

Figure 4B:
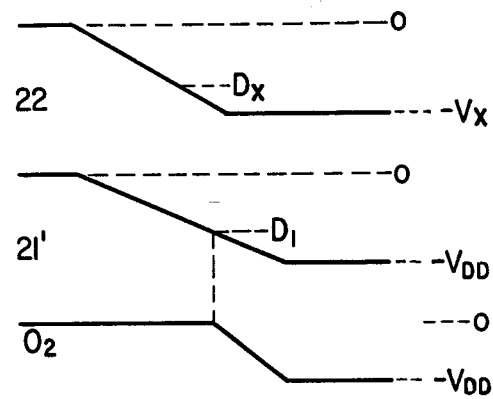
FIG. 4(b) is a timing diagram showing the operation of the circuit in FIG. 4(a)

The operation of the level detector circuit 14 is illustrated in FIG. 4(b). When the voltages present on lines 21' and 22, due to the power sources $-V_{DD}$ and $-V_X$, have reached predetermined detection levels $D_1$ and $D_X$ respectively, the detection signal $O_2$ shifts from a high level to a low level. In the case where the power supply due to $-V_X$, reaches the predetermined level after the power supply due to $-V_{DD}$, the detection signal $O_2$ changes from the high level to the low level at the time when the power supply due to $-V_X$ has reached the predetermined level $D_X$.

In this embodiment, although there are a plurality of power supplies, only one detection signal is treated. Accordingly circuitry in addition to the level detector circuit 14, i.e., the status storage circuit and the counter circuit, can be realized with corresponding parts of the embodiment shown in FIG. 2.

Figure 5A:
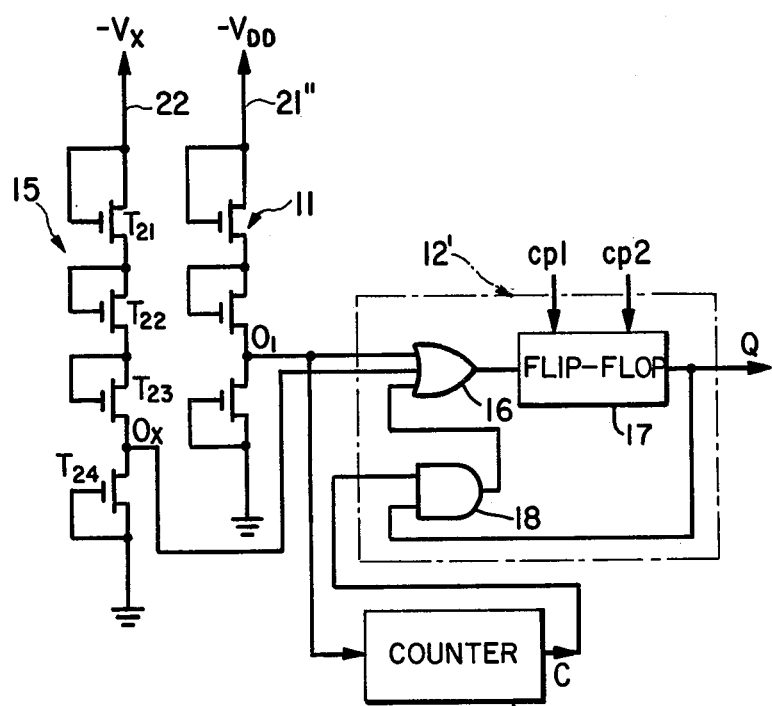
FIG. 5(a) is a circuit diagram showing a third embodiment of this invention.

A third embodiment of this invention will be described with reference to FIGS. 5(a) and 5(b).

In this embodiment, the level detector circuit 11, for the power supply due to $-V_{DD}$ in the line 21", and a level detector circuit 15, for a power supply due to $-V_X$ in the line 22, are independently disposed. As shown in FIG. 5(a), the detector circuit 15 consists of three stages of enhancement type IGFETs T$_{21}$, T$_{22}$ and T$_{23}$, gates and drains of which are commonly connected in respective ones, and a depletion type IGFET T$_{24}$. In this detector circuit 15, the predetermined level D$_X$ is also substantially equivalent to the total value of the threshold voltages of the respective IGFETs T$_{21}$, T$_{22}$ and T$_{23}$. The output O$_1$, from the level detector circuit 11, is entered into an OR gate 16 of a status storage circuit 12', and is also entered into a counter circuit 13 as a reset signal thereto. An output O$_X$ from the level detector circuit 15 is entered into the OR gate 16. An output from the OR gate 16 is entered into a delay type flip-flop 17. Write-in and read-out operations in the delay type flip-flop 17 are performed under the control of clock pulses CP$_1$ and CP$_2$ respectively. An output from the flip-flop 17 is led out as an output Q, and is also led to an AND gate 18 into which a trigger pulse C from the counter 13 is also applied. The output of AND gate 18 is applied to the OR gate 16.

Figure 5B:
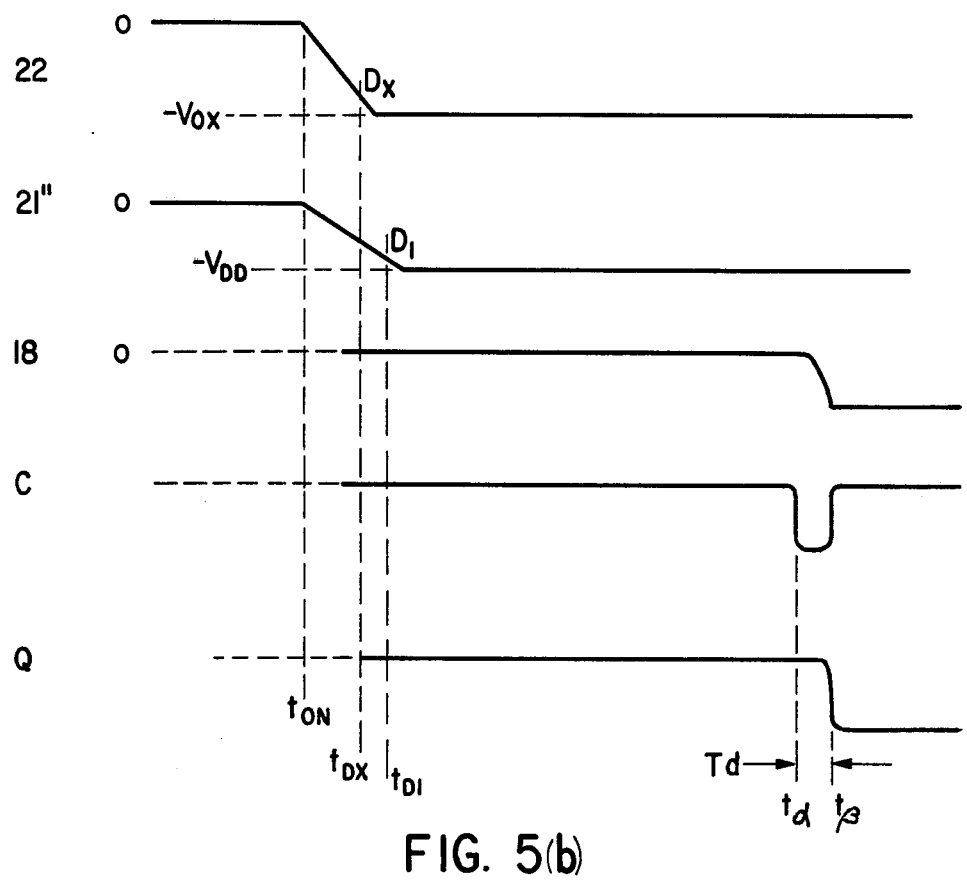
FIG. 5(b) is a timing diagram showing the operation of the circuit in FIG. 5(a).

With reference to FIG. 5(b), the operation of this embodiment will be described. At time t$_{ON}$ the voltage from supplies −V$_X$ and −V$_{DD}$ begins to be impressed on the power supply line 22 and on the power supply line 21 respectively. Detection signals O$_X$ and D$_1$ will then exceed the respective predetermined levels D$_X$ and O$_1$ to become a logic "0" at time t$_{DX}$ and at time t$_{D1}$, respectively.

The output of OR gate 16 holds a logic "1" level until time t$_{D1}$ and is written-in to the flip-flop 17, thereby making the output Q as the auto-clear signal of the logic "1" state. Counter circuit 13 begins a counting operation from the time t$_{D1}$. In this state, since the signal of the logic "1" level, stored in the delay type flip-flop 17, is circulated and stored through the AND circuit 18 and the OR circuit 16, the auto-clear signal Q continues to provide a signal of a logic "1" level until the trigger pulse C, of the logic "0" level, is impressed on the AND circuit 18. This serves to break the loop, at the time t$_a$, when the counter circuit has achieved a predetermined count. Accordingly, the output of the OR gate 16 becomes a logic "0" level at the time t$_a$. This output of a logic "0" is written-in to the flip-flop circuit and is read-out therefrom at time t$_B$, after the delay time T$_d$ of the flip-flop 17, thereby making the output Q a logic "0". Thus, the auto-clear signal, that is the output Q is maintained at a logic "1" level until the time t$_B$. In this embodiment, in place of the detection signal O$_1$, the detection signal O$_X$ can be used for controlling the counter circuit. Also both the detection signals O$_1$ and O$_X$ can be used for this purpose.

In the case where the electronic device has three power supplies requiring level detection a circuit for detecting the levels of two power supplies is constructed as in circuit 14 in FIG. 4(a). This arrangement is used instead of the level detector circuit 15 in FIG. 5, and two level detection signals suffice for the three power supplies. The remaining construction of the circuit in FIG. 5 can be used as it is.

Further, according to this invention, it is possible to detect a predetermined level in the stable region of a power supply for a peripheral circuit. The peripheral supply will be controlled by the same electronic circuit as is the power supply for the electronic circuit itself, thereby achieving stable operation of the whole apparatus, including the peripheral equipment. In this case, as regarding the power supply of the peripheral circuit, the supply voltage can be sensed directly, or indirectly by dividing it with resistors or by detecting a voltage stabilized by a zener diode. As to a circuit arrangement for the sensing, in the case of directly sensing the supply voltage, the description of the embodiment of FIG. 5 applies when −V$_X$ is allowed to be the supply voltage of the peripheral equipment. In the case of indirectly sensing the stable region of the supply voltage, −V$_X$ can be sensed as a voltage associated with the supply voltage in the embodiment of FIG. 5. Heretofore, although this invention has described embodiments which employ power supplies of negative voltages, this invention can also apply to a semiconductor integrated circuit requiring power supplies of positive voltages. And instead of P channel IGFETs, N channel IGFETs can be used. Moreover, instead of the IGFETs employed in the level detector circuit, diodes can be utilized.

Although a specific embodiment of this invention has been shown and described it will be understood that various modifications may be made without departing from the spirit of this invention.

I claim:

1. A signal generator circuit comprising, a level detection circuit for generating a detection signal when a voltage of at least one power supply reaches a predetermined value, a counter circuit which commences a counting operation in response to said detection signal, said counter circuit generating a trigger pulse when said counter circuit has reached a predetermined count, a flip-flop circuit including a first load field-effect transistor of a depletion type and a second load field-effect transistor of an enhancement type, said flip-flop assuming a first state in response to said power supply voltage and a second state in response to said trigger pulse, and means for deriving an output of said flip-flop circuit as an output signal of said signal generator circuit.

2. A signal generator circuit comprising, a storage circuit including a first series circuit including a load means having an enhancement-type insulated-gate field effect transistor, a switching means and an output point and a second series circuit including a load means having a depletion-type insulated-gate field effect transistor, a switching means and an output point, a power supply line, a detection circuit connected to said power supply line for generating a detection signal after arrival of power to the circuit, a delay circuit receiving said detection signal, an output terminal coupled to said output point of said first series circuit, said switching means of said first series circuit being operable in response to a signal present on said output point of said second series circuit and said switching means of said second series circuit being operable in response to an output of said delay circuit and said first series circuit.

3. A signal generator circuit in accordance with claim 1, wherein the duration between said first state and said second state varies in response to changes in the value of said predetermined count.

4. A signal generator circuit in accordance with claim 1, wherein said level detection circuit is comprised of insulated gate field effect transistors.

5. A signal generator circuit in accordance with claim 4, wherein said level detection circuit includes means for generating a detection signal only in response to two power supply voltages reaching first and second predetermined voltage levels, said first level being different in value than said second level.

6. A signal generator circuit comprising a power supply line, a common potential source, a level detection circuit for generating a detection signal when a voltage of at least one power supply reaches a predetermined value, a delay circuit receiving said detection signal and having a predetermined delay period, and a storage circuit including a first node, a second node, a first insulated-gate field-effect transistor of a depletion type having a drain coupled to said power supply line, a gate coupled to said first node and a source coupled to said first node, a second insulated-gate field-effect transistor of an enhancement type having a drain and a gate coupled to said power supply line in common and a source coupled to said second node, a third insulated-gate field-effect transistor of an enhancement type having a drain coupled to said first node and a gate receiving said detection signal, a fourth insulated-gate field-effect transistor having a drain coupled to a source of said third transistor, a gate coupled to an output of said delay circuit, and a source coupled to said common potential source, a fifth insulated-gate field-effect transistor having a drain coupled to said source of said third transistor, a gate coupled to said second node and a source coupled to said common potential source, and a sixth insulated-gate field-effect transistor having a drain coupled to said second node, a gate coupled to said first node and a source coupled to said common potential source, wherein an output signal having a period substantially corresponding to said predetermined period is derived from said second node.

* * * * *